United States Patent [19]

Boudault

[11] Patent Number: 4,539,693

[45] Date of Patent: Sep. 3, 1985

[54] BIT SYNCHRONIZATION ARRANGEMENT FOR A DATA MODEM OR DATA RECEIVER

[75] Inventor: Robert Boudault, Limours, France

[73] Assignee: Telecommunications Radioelectriques et Telephoniques T.R.T., Paris, France

[21] Appl. No.: 488,574

[22] Filed: Apr. 25, 1983

[30] Foreign Application Priority Data

Apr. 28, 1982 [FR] France .................. 82 07325

[51] Int. Cl.³ .............................................. H04L 7/02
[52] U.S. Cl. .................................... 375/110; 375/119; 328/35; 328/185
[58] Field of Search .................... 331/1 A, 17; 328/35, 328/181, 184, 185; 358/148, 159; 375/106, 110, 119, 120; 360/51

[56] References Cited

U.S. PATENT DOCUMENTS

| | | | |
|---|---|---|---|
| 3,743,951 | 7/1973 | Carroll | 328/35 |
| 3,821,470 | 6/1974 | Merrell | 358/159 |
| 3,893,036 | 7/1975 | Cavoretto et al. | 328/181 |
| 3,909,734 | 9/1975 | Palombo et al. | 328/35 |

*Primary Examiner*—Benedict V. Safourek
*Attorney, Agent, or Firm*—Thomas A. Briody; William J. Streeter; Marianne Rich

[57] ABSTRACT

In an asynchronous transmission mode, the bit synchronization arrangement receives data signals in the form of binary pulse trains (at A). It includes an oscillator (3) whose output signal (at C) has a frequency $F_{OS}$ approximately equal to twice the binary rate of the pulse trains and a transition detector (1, 22) which supplies a calibrated voltage pulse (at $B_2$) at each data signal transition. The oscillator supplies a triangular internal signal (at D) at the frequency $F_{OS}$ and a phase correction circuit (2) is provided to reduce the algebraic value of the slope of this signal during each calibrated pulse so as to produce a predetermined constant advancing or delaying phase shift according as the calibrated pulse occurs during a negative or a positive ramp of this signal.

12 Claims, 14 Drawing Figures

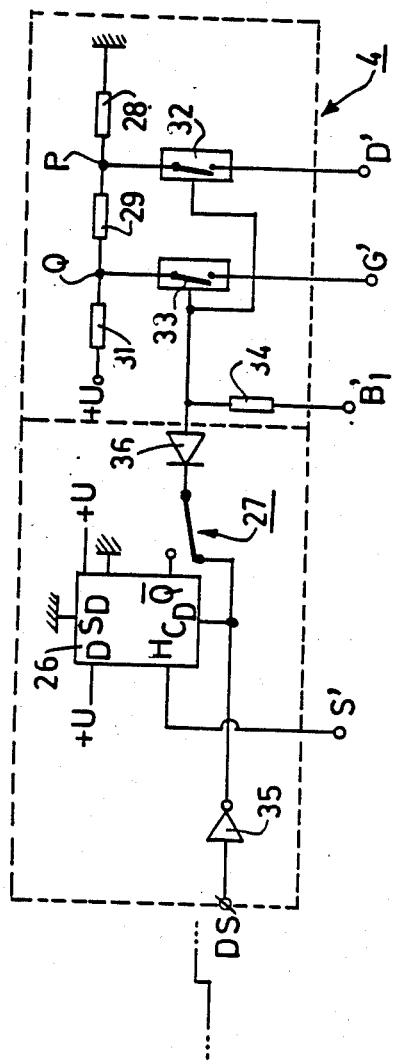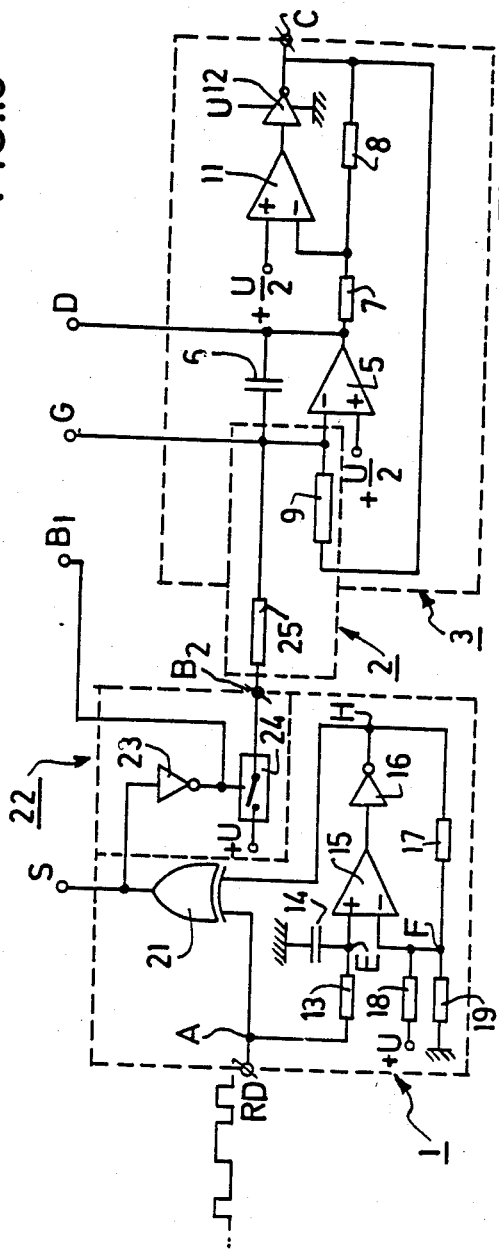

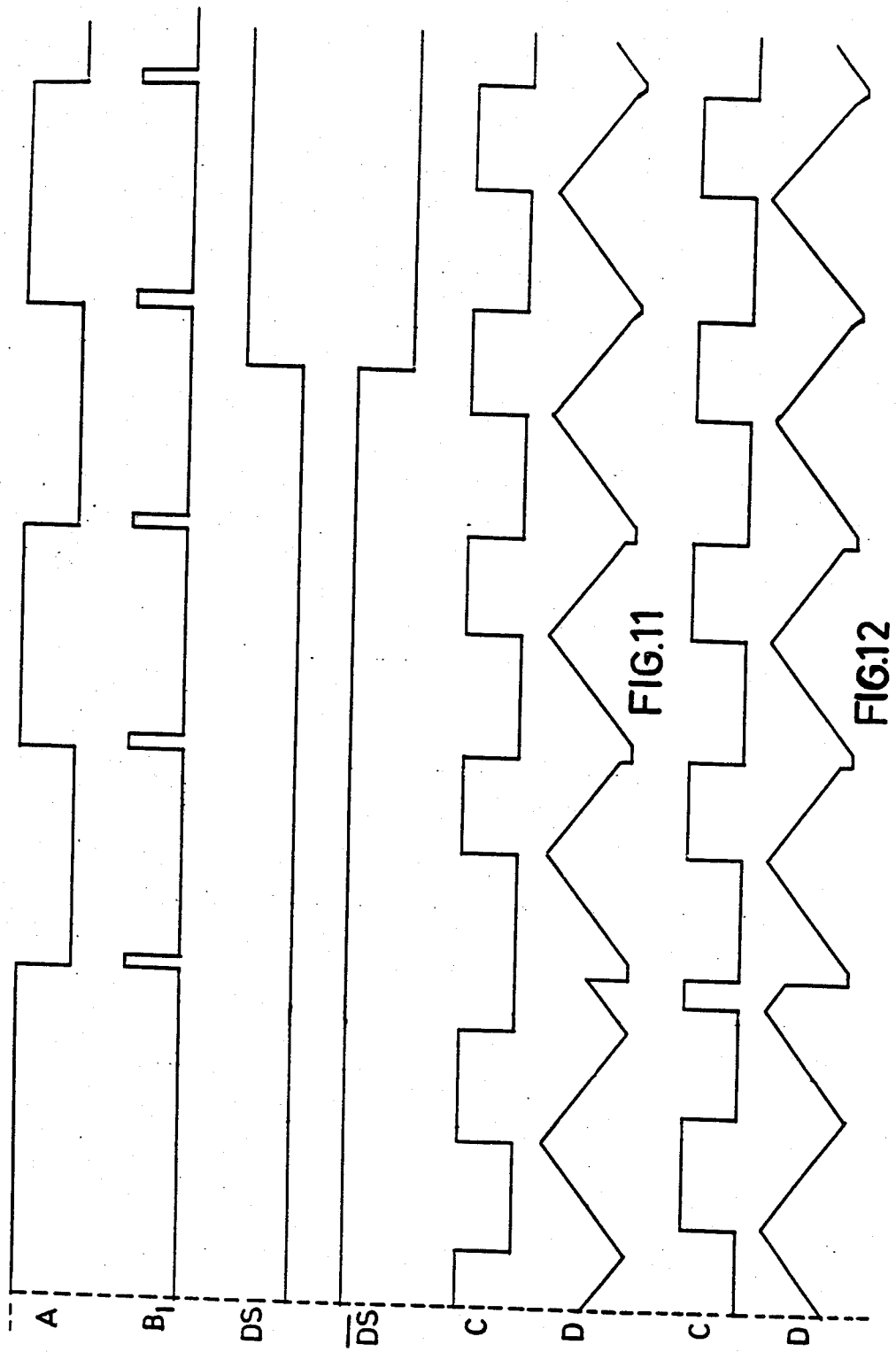

BIT SYNCHRONIZATION ARRANGEMENT FOR A DATA MODEM OR DATA RECEIVER

The invention relates to a bit synchronization arrangement receiving, in an asynchronous transmission mode, data signals in the form of binary pulse trains having detectable transitions between binary states, which circuit comprises an oscillator producing a time base signal whose free frequency is substantially equal to twice the binary rate of said pulse trains, and a transition detector supplying at a first output a positive voltage pulse calibrated in amplitude and in duration in response to each transition of said data signals.

BACKGROUND OF THE INVENTION

This arrangement, which can be used in a data modem (modulator-demodulator) and preferably in a data receiver, permits of providing the modem or the receiver with a generator of a clock signal (time base signal) whih is synchronous with the received data and has the form of a rectangular signal whose positive transitions can be used especially for sampling the data signal, which permits of regenerating this data signal. The invention is preferably used for low-speed voice-band data transmission, the binary rate (modulation rate) preferably being equal to or less than 4800 Bauds.

A known solution, frequently adopted to obtain bit synchronization in an asynchronous transmission mode, consists in utilizing a digital bit synchronization circuit. It is difficult to employ this arrangement for the type of modem considered because it is then necessary to use a quartz time base and a plurality of logic circuits and bistable circuits. Such a solution gives a high performance, but it is bulky, complex and not very economical for the type of application required; in fact, it is addressed to high-performance modems (high speed), for which in virtue of the CCITT standards a very high transmission stability (precision in frequency, for rates above 1200 Bauds, of the order of $10^{-4}$ and use of the LSI technology) is required, whereas the invention rather aims at low and medium speed modems (rates less than or equal to 4800 Bauds), for which the quartz time base may be replaced by an RC oscillator, a precision of frequency of 0.5% being sufficient for the reception.

SUMMARY OF THE INVENTION

The arrangement according to the invention is characterized by its simplicity of implementation allied with a sufficiently high precision, the arrangement yet being entirely of analog design. Analog bit synchronization arrangements are known for asynchronous low-frequency transmissions, particularly from U.S. Pat. No. 3,337,747, according to which the technical problem to be solved is closely related to that of the present application. In the last-mentioned patent, two control circuits are necessary for the synchronization of the time base signal with respect to each data train during a message, besides the circuit for phase resetting at the beginning of a message (rapid synchronization) during the first pulse: a first circuit produces an analog (voltage) signal which is representative of the phase error to be corrected in each period and whose amplitude is an increasing function of this phase error. This signal is utilized to partly correct the phase error so as to reduce this error, which reduction is larger as the said analog signal has a higher amplitude, i.e. larger as the phase error is more important. As a result, the arrangement has a small inertia for large phase shifts, especially for most parasitic pulses in the data signal, and a great inertia for small phase shifts, which implies a low efficacy in both cases because the influence of the parasitic pulses is only slightly attenuated and an accurate phase resynchronization of the two signals is never obtained (presence of so-called "jitter"). It will further be noted that a systematic phase correction in each period of the time base signal thereby implies a frequency correction, which holds in a general sense and especially for the arrangement according to the aforementioned U.S. Patent. In that patent, the phase correction circuit does not permit of controlling simultaneously the phase and the frequency, a second circuit for controlling the frequency being always necessary. This second circuit is composed of means for integrating said analog signal so that a second signal is obtained which is representative of the average phase shift detected during the successive transmissions of the data signal, this second signal being applied to the oscillator in order to minimize the said average phase shift. Especially, the presence of this second circuit complicates the arrangement and raises doubts as regards its proper functioning. The invention aims at realizing an analog bit synchronization arrangement which is simple and economical without its precision being adversely affected because it has to be usable for data trains in asynchronous transmission modes having a binary rate which may increase up to 4800 Bauds.

It is an object of the invention to provide an analog bit synchronization arrangement, in which a single signal processing circuit permits of obtaining an accurate phase synchronization free of jitter (which additionally implies a strict frequency adjustment). Another object of the invention is to obtain an arrangement which presents a great inertia, irrespective of the phase shift, by means of a correction step having a predetermined constant value.

The disadvantages of the known arrangements are avoided and the above-mentioned objects are achieved owing to the fact that the bit synchronizing arrangement defined in the preamble is characterized in that said oscillator supplies a triangular internal voltage signal at the frequency of said time base signal and in that phase correction means are provided between a first output of said transition detector and the input of said oscillator for modifying the slope of the said internal voltage signal in the sense of a predetermined algebraic value reduction during said calibrated pulse so as to obtain correction step in the form of a predetermined constant delay in phase when said calibrated pulse occurs during a positive ramp of said internal voltage signal and a predetermined advance in phase when said calibrated pulse occurs during a negative ramp of said internal voltage signal.

In a preferred embodiment, the oscillator comprises an operational amplifier having a capacitor connected to its inverting input so as to form an integrating circuit, the output of which is connected to a bistable circuit having threshold hysteresis and supplying a time base signal in the form of a two-level voltage which is applied to one end of a first resistor, the other end of which is connected to the inverting input of said operational amplifier, and the arrangement is characterized in that said triangular internal voltage signal is obtained at the output of said operational amplifier and in that said phase correction means are constituted by a second resistor which is connected between said first output of said transition detector and the inverting input of said operational amplifier and whose value is of the same order as that of said first resistor.

In this embodiment, the transition detector comprises, for example, a monostable circuit and a current injector. Thus, corrections are made in the constant current charge or discharge of the capacitor of the oscillator such that the charging time is lengthened by a predetermined time interval when a transition of the data signal occurs during the charge and the discharging time is shortened by a predetermined time interval when a transition of the data signal occurs during the discharge of the capacitor. The result of these corrections in the charge or discharge is that, after a given number of transitions of the data signal, the instant of occurrence of a transition and the instant of occurrence of a leading edge of the output signal of the oscillator coincide substantially, which corresponds to the desired synchronization (convergence phenomenon). The main advantage of the invention is that it can be realized and utilized in a simple manner.

The bit synchronization arrangement permits of maintaining the synchronization for the duration of the messages. Now, the time interval between two messages has an arbitrary length. Two possibilities then exist to obtain the synchronization at the beginning of a message:

to provide a message prefix comprising enough transitions to be sure that the synchronization will be obtained before the real beginning of the message (information proper), in which case bit synchronization arrangement described above can be suitably used;

to provide the receiver with a circuit ensuring a brute phase resetting at the beginning of a message immediately after the first transition, in which case it is necessary to add a rapid synchronization circuit to the bit synchronization arrangement.

Another advantage of the invention is that the analog bit synchronizer indicated above is compatible with a simple analog rapid synchronization circuit which receives a data detection signal as well as a second output signal originating from said transition detector and whose output is constituted by two conductors connected to the ends of the capacitor of the oscillator.

BRIEF DESCRIPTION OF THE DRAWINGS

The following description with reference to the accompanying drawings, given by way of example, permits of understanding clearly how the invention can be realized. In these drawings:

FIG. 1 shows the functional circuit diagram of an embodiment of the invention;

FIG. 10 shows the functional circuit diagram of a rapid synchronization circuit adapted to the bit synchronizer arrangement according to the invention;

FIGS. 11 and 12 show time diagrams illustrating the operation of a first embodiment of the rapid synchronization circuit of FIG. 10;

DETAILED DESCRIPTION OF THE PREFERRED EMBODIMENTS

Figure 2:
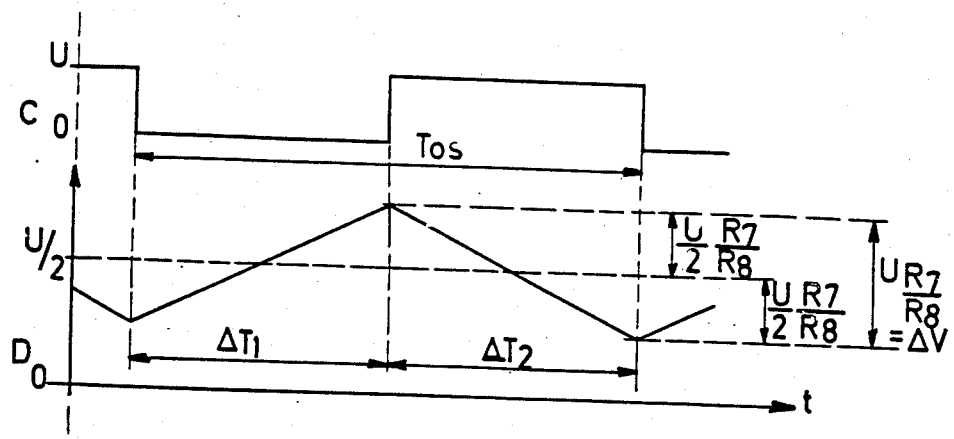
FIG. 2 shows a time diagram for explaining the operation of the known oscillator used.

FIG. 1 shows a transition detector 1 which receives a data signal RD in the form of "1" or "0" bits of a duration T, this signal RD applying a voltage $+U$ for the bits of logic value "1" and of a voltage zero for the bits of logic value "0". A first output of the detector 1 supplies to a phase corrector 2 a signal constituted by pulses whose leading edge coincides with each transition of the signal RD and whose duration, having a predetermined value Tx and being constant on first approximation, is determined by a monostable circuit of the detector 1. The phase corrector 2 receives at a second input the output signal C of a triangular wave oscillator 3 of a type described in French Patent Application No. 2,453,536 in the name of the Applicant or in U.S. Pat. No. 4,039,952. The output of the phase corrector 2 is looped back to the input of the oscillator 3. The phase corrector 2 is realized in an original manner forming the basic feature of the invention.

With reference to FIG. 1, FIG. 10 of the drawings shows a rapid synchronization circuit 4 which receives the data detecting signal DS at a first input, a second input B'1 being intended to receive a second output signal B1 of the detector 1. The (double) output of the circuit 4 is connected to a second (double) input of the oscillator 3. The signal DS has a voltage zero in the absence of data and a voltage $+U$ in the presence of data. The leading edge of the signal DS can appear either before or after the first transition of each data message (train).

The oscillator 3 (FIG. 1) comprises a high-gain operational amplifier 5 connected as an integrator, a capacitor 6 of a capacity $C_6$ being connected between its inverting input G and its output D. The output D is looped back to the inverting input through the cascade arrangement of three resistors 7, 8 and 9 having values $R_7$, $R_8$ and $R_9$, respectively, the resistor 9 being designated as the first resistor. The voltage at the junction point of the resistors 7 and 8 is compared with the voltage $U/2$ in an operational amplifier comparator 11 followed by an inverter 12. The elements 11 and 12 constitute a bistable circuit with threshold hysteresis. The output C of the inverter 12, connected to the junction point of the resistors 8 and 9, alternately supplies the voltage U or the voltage 0. The presence of the inverter 12 is justified by the fact that the comparator 11 does not operate linearly and that the voltage at C has to be as close to U or 0 as possible. For the detailed description and the operation of the oscillator 3, reference is made to French Patent Application No. 2,453,536.

The result of the operation is indicated by the time diagram of FIG. 2; the point D carries a symmetrical sawtooth voltage (triangular) which is centred about $U/2$ and whose positive and negative ramps have the same slope in absolute value. Let it be assumed that:

I is the current traversing the resistor 9 in one or the other direction,

ΔV is the deviation of the sawtooth voltage,
$F_{OS}$ is the frequency of the oscillator ($F_{OS}=1/T_{OS}$),
ΔT$_1$ or ΔT$_2$ is the duration of a positive or negative ramp of the sawtooth (ΔT$_1$=ΔT$_2$=Δt=T$_{OS}$/2).
Then the following relations are obtained:

$$\frac{I}{C_6 \Delta V} = \frac{1}{\Delta t} \text{ with } \Delta V = U \frac{R_7}{R_8} \text{ and } I = \frac{U}{2R_9}$$

$$F_{OS} = \frac{1}{2\Delta t} = \frac{I}{2 C_6 \Delta V} = \frac{U R_8}{4 R_9 C_6 U R_7} = \frac{R_8}{R_7} \cdot \frac{1}{4 R_9 C_6}$$

In practice, the value R8/R7=2 is chosen (which ratio is related to the performances of the operational amplifiers used), from which it follows that:

$$F_{OS} = \frac{I}{2 R_9 C_6} = \frac{Y_9}{2C_6} \left( Y_9 = \frac{1}{R_9} \right)$$

and $$T_{OS} = \frac{2C_6}{Y_9} \quad (O)$$

The output signal of the oscillator at the point C (see FIG. 2) is a square-wave signal of an amplitude between 0 and U, whose leading edges coincide with each end of a positive ramp of the sawtooth and whose trailing edges coincide with each end of a negative ramp.

The transition detector 1 (FIG. 1) is constituted by a monostable circuit supplying to an output S, designated as third output, a negative rectangular-wave voltage upon each positive or negative transition of the data signal received by it. The width of these rectangular pulses is proportional (see below) to the product $R_{13}C_{14}$, $R_{13}$ being the value of a resistor 13 connected to the reception terminal of the data signal RD (point A) and $C_{14}$ being the capacity of a capacitor 14 arranged in series with the resistor 13 between the point A and ground.

The junction point of the elements 13 and 14 (point E) is connected to the non-inverting input of a comparator 15, whose output is looped back through an inverter 16 (whose output is designated by H) and a resistor 17 having a value $R_{17}$ to its inverting input (point F). The potentiometer arrangement of two resistors 18 and 19 of values $R_{18}$ and $R_{19}$ supplied by the voltages U and 0 permits of obtaining at F a threshold voltage alternately equal to $V_S$ or $U-V_S$ according as the point H is connected to the voltage 0 or to the voltage U such that:

$$U - V_S = \frac{U}{2} + \frac{\text{Req } U}{2(\text{Req} + R_{17})}$$

from which it follows that:

$$V_S = \frac{U}{2} - \frac{\text{Req } U}{2(\text{Req} + R_{17})} \text{ with Req} =$$

$$\frac{R_{18} R_{19}}{R_{18} + R_{19}} \text{ and } R_{18} = R_{19}$$

In practice, Req is chosen to be equal to $R_{17}$ (which value is related to the performances of the operational amplifiers used), from which it follows that;

$$U - V_S = 3U/4 \text{ and } V_S = U/4$$

The data input (point A) and the point H are connected to the inputs of an Exclusive OR circuit 21, whose output is connected to the point S. The point S constitutes inside the detector 1 the input of a current injector 22 comprising an inverter 23, whose output (point B$_1$) controls an interruptor 24 whose output (point B$_2$, designated as first output of the detector 1) is connected through a resistor 25 designated as second resistor and having a value $R_{25}$ to the inverting input of the operational amplifier 5. In FIG. 1, the elements 5, 11, 12, 15, 16, 21, 23 and 24 are supplied by the voltages U and 0 (ground).

Figure 3:
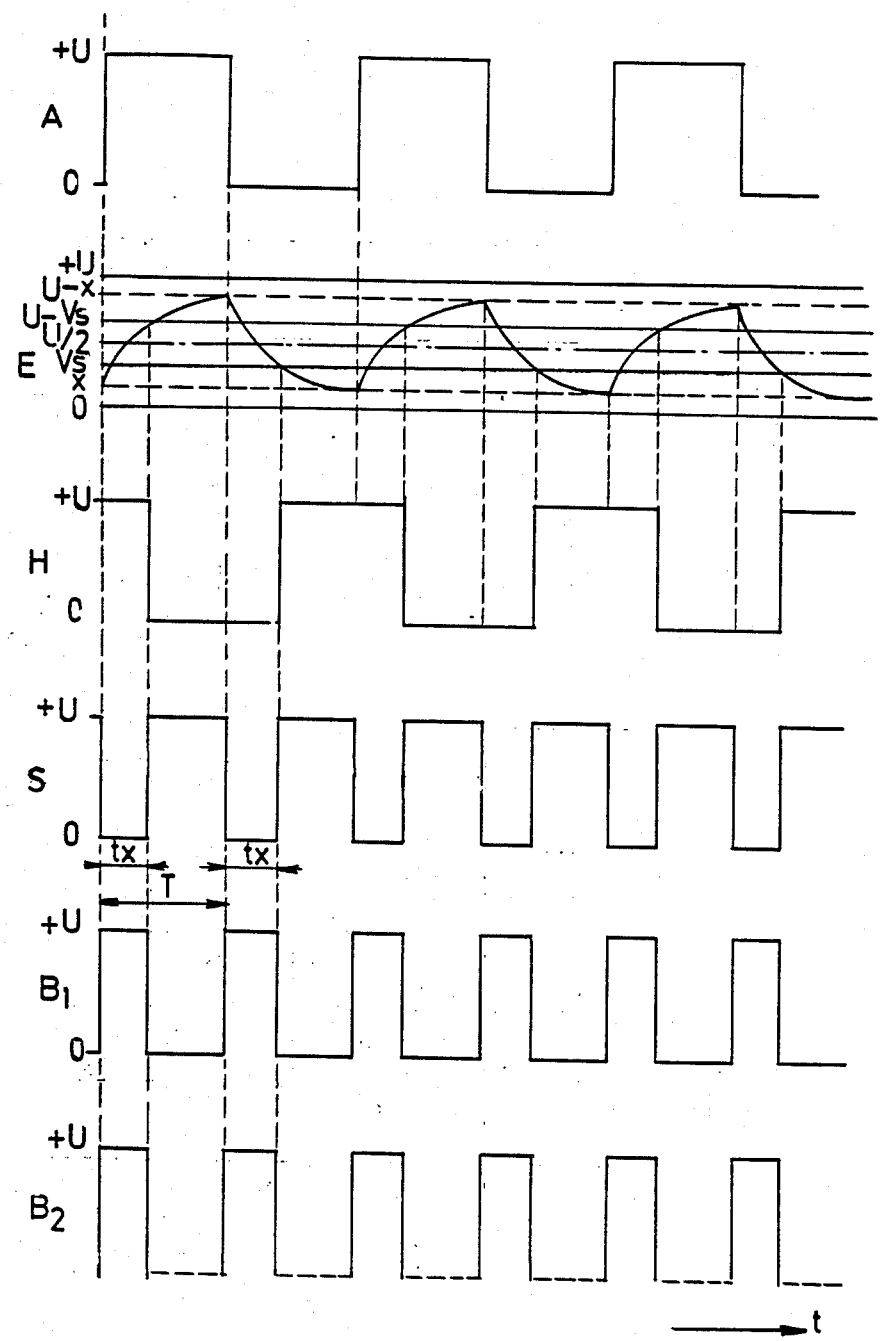
FIG. 3 shows a time diagram for explaining the operation of the transition detector used.

The time diagrams of FIG. 3 serve to explain the operation of the transition detector constituted by the element 1 comprising the element 22, in the particular case of a regularly alternating succession of data bits "1" and "0". In this Figure, the waveform of the voltage signals at the points A, E, H, S, B$_1$ and B$_2$ is represented.

Calculation of the period $t_x$ of the monostable circuit as a function of T, $R_{13}$, $C_{14}$, U and $V_S$:

$$V_{EM} = (U-x)(1-e^{-t/R_{13}C_{14}}) + x$$

i.e. at the instant $t_x$:

$$U - V_S = (U-x)(1-e^{-t_x/R_{13}C_{14}}) + x \quad (1)$$

and at the instant T:

$$U - x = (U-x)(1-e^{-T/R_{13}C_{14}}) + x \quad (2)$$

it follows from the equality (1);

$$V_S = (U - x)e^{-t_x/R_{13}C_{14}}, \text{ i.e. } e^{-t_x/R_{13}C_{14}} = \frac{V_S}{U - x} \quad (3)$$

and from the equality (2):

$$x = (U - x)e^{-T/R_{13}C_{14}}, \text{ i.e. } x = \frac{U e^{-T/R_{13}C_{14}}}{1 + e^{-T/R_{13}C_{14}}} \quad (4)$$

it follows from the equalities (3) and (4):

$$t_x = R_{13}C_{14} \text{ Log } \frac{U - x}{V_S} \quad (5)$$

$$t_x = R_{13}C_{14} \text{ Log } \frac{U}{V_S} \left( 1 - \frac{e^{-T/R_{13}C_{14}}}{1 + e^{-T/R_{13}C_{14}}} \right)$$

or:

$$t_x = R_{13}C_{14} \text{ Log } \left( \frac{U}{V_S} \cdot \frac{1}{1 + e^{-T/R_{13}C_{14}}} \right)$$

For $V_S = \frac{U}{4}$ (see above):

$$t_x = R_{13}C_{14} \text{ Log } \frac{4}{1 + e^{-T/R_{13}C_{14}}}$$

Formula (5) holds for a regularly alternating succession of bits "1" and "0". In practice, the time separating two successive transitions of the data signal RD is a multiple k of T and the general formula to be considered is:

$$t_x = R_{13}C_{14} \text{Log} \frac{4}{1 + e^{-kT/R_{13}C_{14}}} \quad (k \text{ positive integer})$$

It will now be seen hereinafter that $t_x$ must not depend upon the succession of bits "1" and "0" received at RD. It is therefore necessary that the term $e^{-T/R_{13}C_{14}}$ and a fortiori the term $e^{-kT/R_{13}C_{14}}$ is negligible with respect to unity, i.e. $e^{-T/R_{13}C_{14}} < <1$. The value of $t_x$ is of the same order as that of the correction step $\theta$ of the bit synchronizer, as will be seen hereinafter, these two values being chosen to be small with respect to T and, for example, of the order of T/16.

It can be shown by means of the equation:

$$\frac{t_x}{R_{13}C_{14}} = \text{Log} \frac{4}{1 + e^{-16t_x/R_{13}C_{14}}} \quad (6)$$

that the term $e^{-16t_x/R_{13}C_{14}}$ is negligible with respect to unity, irrespective of T (T not occurring in the equation (6)). The equations obtained starting from $t_x = T/8$ and even from $t_x = T/4$ show that the term $e^{-T/R_{13}C_{14}}$ still remains negligible for these two last-mentioned values of $t_x$. When choosing $t_x = T/16$, formula (5) is consequently simplified to:

$$t_x = R_{13}C_{14} \text{Log } 4 = 1.38 R_{13} C_{14},$$

which corresponds, for example, for a binary rate of 1200 Bauds, to $$t_x = 1/(1200 \cdot 16) = 5.2 \ 10^{-5} \text{ s}.$$

From this it follows that:

$$R_{13}C_{14} = t_x/1.38 = 3.77 \ 10^5 \text{ s}.$$

The invention mainly relates to the manner in which the transition detector (1.22) acts upon the oscillator 3 during each period $T_{OS}$ by modifying its phase with respect to the signal RD by injection of current through the resistor 25 into the capacitor 6 during the time $t_x$ elapsing from each transition of the data signal. In this connection it is to be noted that the phase corrector 2 is represented in FIG. 1 as the assembly of the two resistors 9 and 25, the junction point of which is connected to one end of the capacitor 6 and to the inverting input (at the voltage U/2) of the operational amplifier 5.

Figure 4:
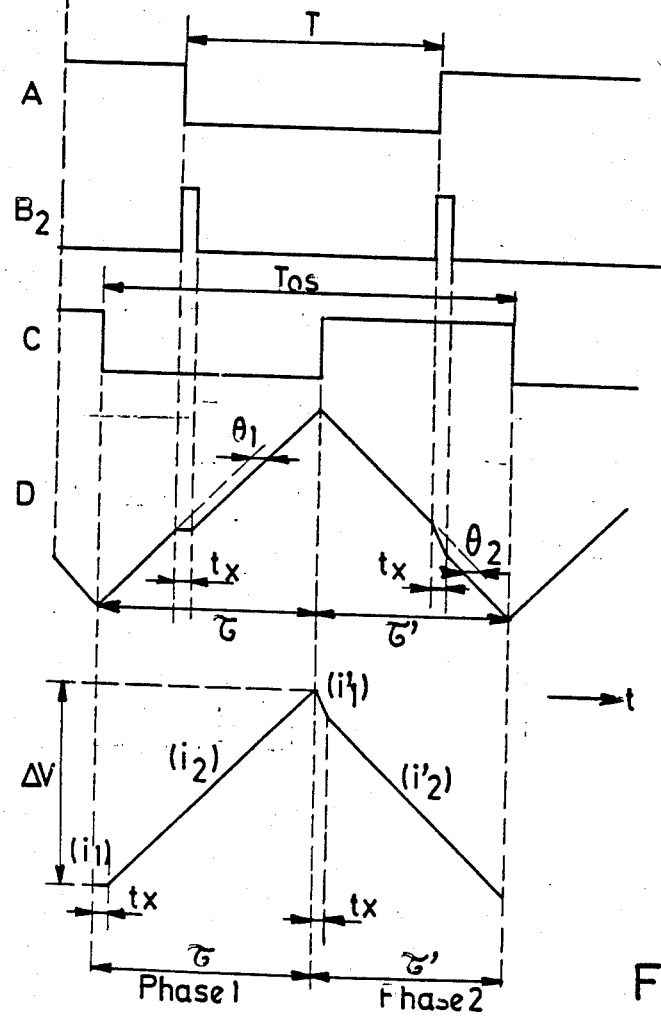
FIG. 4 shows a time diagram for explaining the principle of the operation of the bit synchronizer arrangement according to the invention.

FIG. 4 shows a time diagram of the voltage signals at the points A, B$_2$, C and D permitting to explain the operation of the bit synchronizer circuit in the case in which the period $T_{OS}$ is sufficiently long with respect to the period T so that the shifts $\theta_1$ and $\theta_2$ in the signal at D can occur during the same period $T_{OS}$, $2\pi\theta_1/T_{OS}$ being the phase shift (delay) obtained by the phase correction when the transition of the data signal (signal A) occurs during phase 1 (positive ramp at D) and $2\pi\theta_2/T_{OS}$ being the phase shift (advance) obtained by the phase correction when the transition of the data signal occurs during phase 2 (negative ramp). It should further be noted that:

$$\theta_1 \cong \theta_2 \cong t_x.$$

On the other hand, it should be noted that when the transition of the data signal occurs during phase 1 (duration $\tau$), the charge current $i_1$ of the capacitor 6 is equal to the difference of the currents traversing the first and second resistors 9 and 25, respectively.

If on the contrary the transition occurs during phase 2 (duration $\tau'$), the current $i'_1$ is equal to the sum of the currents traversing the resistors 9 and 25.

The values of the slopes of the various segments of D being proportional to the charge or discharge currents of the capacitor 6, if $R_{25}$ is chosen to be equal to $R_9$, as is generally the case in practice, there is obtained as shown by the following calculation:

$$\theta_1 = t_x = \theta_2 = \theta,$$

$\theta$ being the correction step (advance or delay). In fact, the capacitor 6 being charged with a constant current, there is obtained:

phase 1: $C_6 \Delta V = i_1 t_x + i_2(\tau - t_x)$ \quad (8)

phase 2: $C_6 \Delta V = i'_1 t_x + i'_2(\tau' - t_x)$ \quad (9).

On the other hand (whilst using the admittances $Y_i$) there is obtained:

$$\Delta V = U(Y_8/Y_7)$$

$$i_1 = (U/2)Y_9 - (U/2)Y_{25} \text{ and } i_2 = (U/2)Y_9$$

$$i'_1 = (U/2)Y_9 + (U/2)Y_{25} \text{ and } i'_2 = (U/2)Y_9$$

From the equality (8) it follows:

$$C_6 U(Y_8/Y_7) = i_1 t_x + i_2 \tau - i_2 t_x = i_2 \tau + t_x(i_1 - i_2)$$

$$C_5 U(Y_8/Y_7) = (U/2)(Y_9 \tau - Y_{25} t_x) \text{ i.e.:}$$
$$Y_9 \tau = 2C_6(Y_8/Y_7) + Y_{25} t_x$$

or:

$$\tau = \frac{2C_6 \frac{Y_8}{Y_7} - Y_{25} t_x}{Y_9}$$

By an analogous calculation there is derived from the equality (9):

$$\tau' = \frac{2C_6 \frac{Y_8}{Y_7} - Y_{25} t_x}{Y_9}$$

In practice there is chosen:

$$\frac{Y_8}{Y_7} = \frac{1}{2} \left( \Delta V = \frac{U}{2} \right) \text{ and there is obtained:}$$

$$\tau = \frac{C_6 + Y_{25} t_x}{Y_9} \quad (10)$$

and $$\tau' = \frac{C_6 - Y_{25} t_x}{Y_9} \quad (11)$$

The equalities (10) and (11) show that two successive corrections of opposite sign cancel one another. This is the case for FIG. 4, for which there is obtained:

$$T_{OS} = \tau + \tau' = 2C_6/Y_9 = 1/F_{OS}$$

which formula is identical to formula (0) given above in the absence of phase corrections.

In order that there is a modification of the frequency $F_{OS}$ (of the period $T_{OS}$) and hence a correction in one sense (delay) or in the other sense (advance), it is necessary that the shift of the type $\theta_1$ or $\theta_2$ occurs only once during each period $T_{OS}$ and is always of the same type until synchronization is obtained. It can be shown that this is the case when and only when the frequencies F and $F_{OS}$ or the corresponding periods are sufficiently close to each other and more precisely when:

$$|T-T_{OS}| < \text{Inf}(\theta_1,\theta_2) \qquad (12)$$

Inf ($\theta_1$, $\theta_2$) being the smaller of the two values $\theta_1$ and $\theta_2$. In the following description it is assumed that $R_{25}=R_9$, from which it follows that: $t_x=\theta_1=\theta_2=\theta$ and the condition (12) becomes:

$$|T-T_{OS}| < \theta \qquad (13)$$

Figure 5:
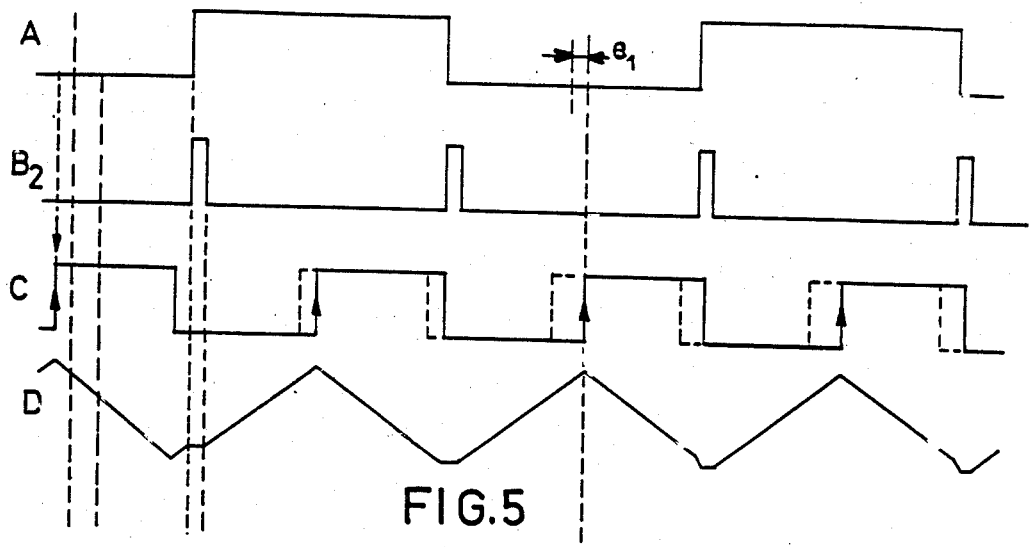
FIGS. 5, 6, 7, 8 and 9 show time diagrams illustrating the operation of the bit synchronizer arrangement as a function of various initial conditions for the data and time base signals, as a function of the relative free frequencies of these two signals, or in the presence of a particular form of the data signal.

Under these conditions, if the first transition occurs during a positive ramp (phase 1), the period of the oscillator is (see the time diagram of FIG. 5):

$$T_{OS} = \frac{2C_6 + Y_{25} t_x}{Y_9} \qquad (14)$$

or, in the particular preferred case in which $Y_{25}=Y_9$:

$$T_{OS}=(2C_6/Y_9)+\theta=T_{OS}+\theta$$

and the condition (13) becomes:

$$0 < T_{OS}-T < 2\theta.$$

This double inequality thus means that in the case of an advance of the oscillator signal with respect to the data signal, a phase correction between 0 and $2\theta$ is made in each oscillator period (reduction of $F_{OS}$) until synchronization is obtained, which is achieved when each trailing edge of the signal at C substantially coincides with each transition of the signal at A.

Figure 6:
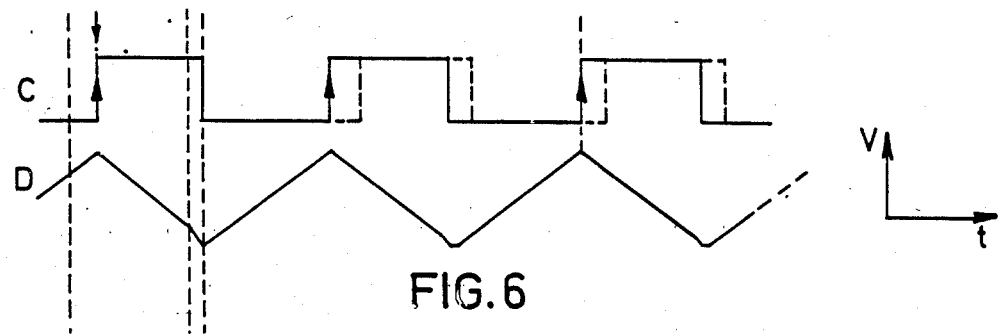

In a symmetrical manner, if the first transition occurs during a negative ramp (phase 2), the period of the oscillator is (see the time diagram of FIG. 6):

$$T'_{OS} = \frac{2C_6 - Y_{25} t_x}{Y_9} \qquad (15)$$

or in the particular case in which $Y_{25}=Y_9$:

$$T'_{OS}=(2C_6/Y_9)-\theta=T_{OS}-\theta$$

and condition (13) becomes:

$$-2\theta < T'_{OS}-T < 0$$

This double inequality means that in the case of a delay of the oscillator signal with respect to the data signal, a phase correction between 0 and $2\theta$ is made in each oscillator period (increase of $F_{OS}$) until synchronization is obtained, which, as in the preceding case, is achieved when each trailing edge of the signal at C substantially coincides with each transition of the signal at A.

It should be noted that in the general formulae (14) and (15) for $Y_{25}=0$ ($R_{25}=\infty$) there is obtained:

$$T_{OS} T'_{OS} = T_{OS}.$$

The synchronization is obtained as soon as a trailing edge of the signal at C occurs during a pulse of the signal at $B_2$. For the duration $t_x$ (or $\theta$) of this pulse, a double correction is then obtained, first of the type $\theta_2$ (phase 2) and of a duration $at_x$ ($a\theta$ with: $0<a<1$), until the output of the oscillator (point C) changes from U to 0, and then of the type $\theta$HD 1 (phase 1) and of a duration $(1-a)t_x$, or $([1-a]\theta)$. In the particular case in which $T=T_{OS}$, there is obtained: $a=1-a=0.5$. When the two periods are slightly different, within the limits of condition (13) the durations: $a\theta$ and $(1-a)\theta$ have ratios such that the period of the oscillator is maintained exactly equal to the period T of the data, the maintenance of the synchronism implying the equality of the frequencies. This operation is visible in the time diagrams of FIGS. 5 and 6 for the particular case in which: $a=1-a=0.5$.

It should be further noted that in the state of synchronism the positive ramp at D begins at a time $t_x$ (or $\theta$) after the transition of the data signal. This means that, when the slopes of the positive and negative ramps at D are equal in absolute value, the sampling instant (leading edge at C) is each time delayed by the duration $\theta_1$ (or $\theta$) with respect to the optimum sampling instant (T/2 after a transition) in the case in which: $T=T_{OS}$. If the periods T and $T_{OS}$ satisfy the condition (13), this delay in sampling thus lies between $\theta_1/2$ and $3\theta_1/2$ (or $\theta/2$ and $3\theta/2$). It is clear that in practice $\theta$ is chosen to be equal to $\theta=T/16$. The transition of the clock signal at the centre of the bit (leading edge at the point C) consequently is shifted systematically by one delaying step with respect to the theoretical transition at the centre of the bit and is not affected by jitter (equal to $\pm 1$ step), as in a digital bit synchronizer.

Figure 7:
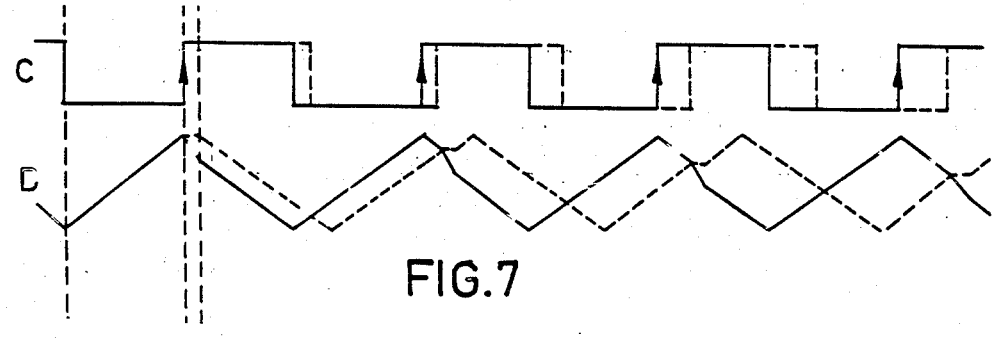

As is illustrated in the time diagram of FIG. 7, which starts from a phase opposition between the data received (point A) and the clock frequency (point C) it should be noted that in the case in which: $T=T_{OS}$ the synchronization by an advancing effect (full line at C and D) or by a delaying effect (broken line) at D) occurs at the eight transition of the data signal (point C). This corresponds to a "correction" in phase of T/2 by a correction of $\theta=T/16$ at each transition of the data signal. The broken line at C indicates what would be the oscillator signal in the absence of a correction (advance or delay).

Figure 8:
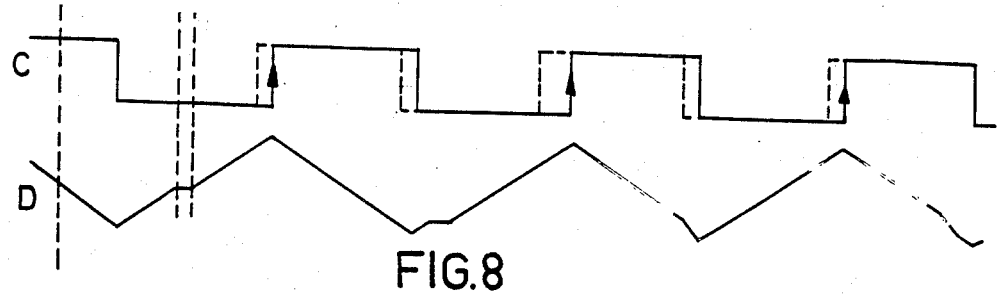

The time diagram of FIG. 8 shows the case in which: $|T'T_{OS}|>\theta$ (in case: $T_{OS}-T>\theta$).

It is apparent from this Figure that for the correction of $T_{OS}$ a change takes place from the correction of the type $\theta_1$ (delay) to the correction of the type $\theta_2$ (advance) without obtaining synchronization.

Figure 9:
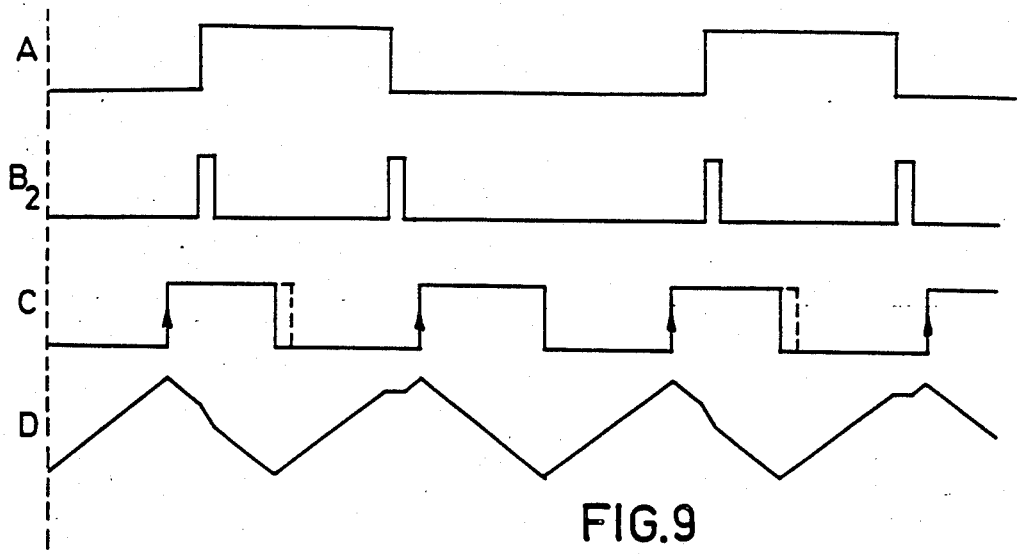

Furthermore, as shown in FIG. 9, due to a bias distortion of the received data signal exceeding the correction step $\theta$, the synchronization cannot be obtained by the bit synchronizer circuit according to the invention, even if condition (13) is satisfied, and in this case it is necessary to use a rapid synchronization circuit which has the disadvantage of an inertia equal to zero and of a 100% sensitivity to the parasitic pulses in the data signal.

It has been shown above that $T/2\theta$ transitions are required to obtain synchronization with certainty, i.e. 8 transitions for $\theta = T/16$. Consequently, it is sufficient to use a prefix of 8 alternating bits (four "0" and four "1") at the beginning of a message to ensure a correct synchronization. In this case, the maximum permissible bias distortion upon reception is less than 1/16, i.e. less than 6%.

It is sometimes useful to obtain synchronization immediately from the beginning of the message. It is then necessary to add to the arrangement already described (FIG. 1) a rapid synchronization device (FIG. 10-block 1). In this case, there is a data detection signal DS available which when ascending, as described below, provokes the passage from the rapid synchronization to the slow synchronization obtained by means of the circuit of FIG. 1.

Figure 13:
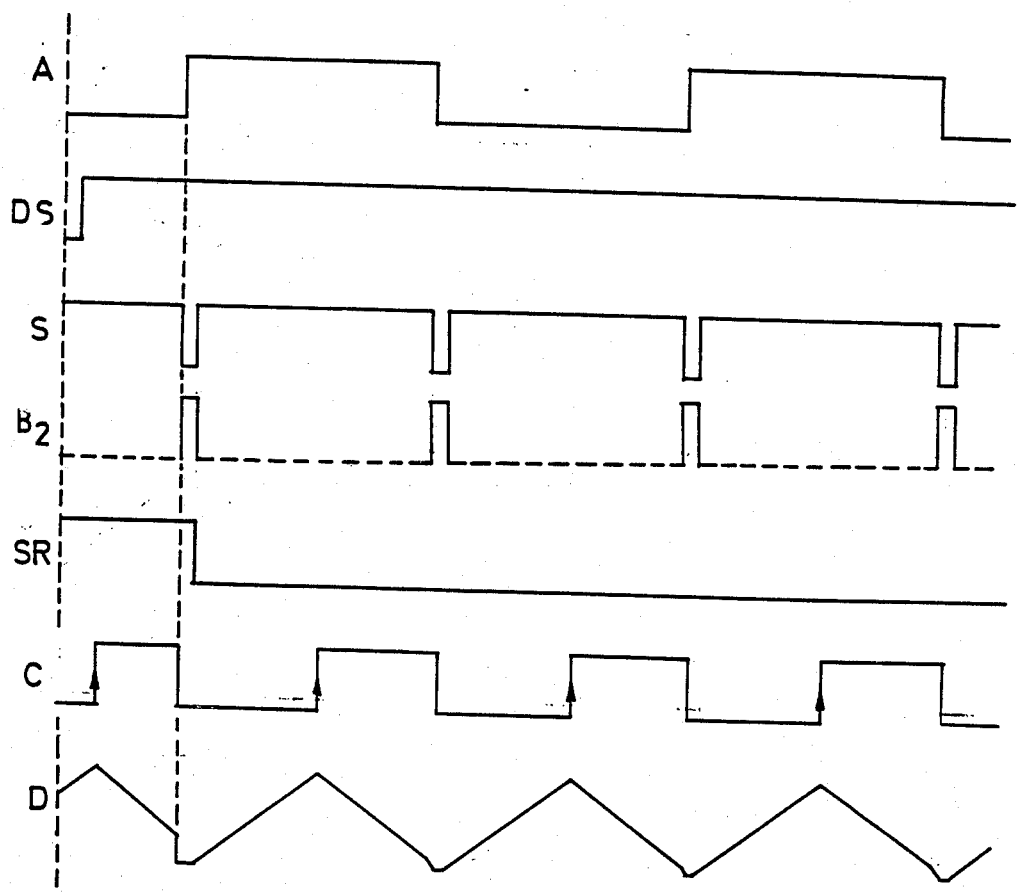
FIG. 13 shows a time diagram illustrating the operation of the second embodiment of the rapid synchronization circuit of FIG. 10.

The circuit of FIG. 10 may comprise or may not comprise D flip-flop 26 according as the signal DS ascends before or after the first transition of the signal RD (beginning of the message). This particularity is indicated symbolically by the presence of a two-position switch 27. First the part of FIG. 10 is described which is situated on the righthand side of the median broken line, supposing that this part is not connected to the lefthand part of the Figure. This righthand part comprises three resistors 28, 29 and 31 designated as third, fourth and fifth resistor, respectively, having values $R_{18}$, $R_{19}$ and $R_{31}$, respectively, and arranged in cascade between ground and the voltage +U. The junction point of the resistors 28 and 29 (point P) is connected to a terminal D' through an interruptor 32 and the junction point of the resistors 29 and 31 (point Q) is connected to a terminal G' through an interruptor 33. The interruptors 32 and 33 are controlled in parallel by means of a second input terminal $B'_1$ via a resistor 34 having a value $R_{34}$ such that they are opened for a control voltage zero and are closed for a control voltage equal to +U. The values of the resistors 28, 29 and 31 are chosen so that the potentials at P and Q are equal to $(1-R_7/R_8)U/2$ and $U/2$, respectively. In order to connect the circuit of FIG. 10 to the circuit of FIG. 1, the terminals $B_1$ and $B'_1$, G and G', D and D', respectively, are connected to one another. As a result, immediately after the first transition of the signal RD the potential of the point C changes from U to 0, the capacitor 6 being discharged very rapidly through the resistor 29 during a time just shorter than $t_x$, and the voltage ramp of the signal at D begins at its correct voltage value $(1-R_7/R_8)U/2$ immediately after the end of the period $t_x$. This operation is indicated at the lefthand part of the time diagrams of FIGS. 11, 12 and 13.

The lefthand part of FIG. 10 represents a circuit which permits of utilizing the fact that the data detection signal DS is available.

If the signal DS ascends after the first transition of the signal RD (see FIGS. 11 and 12), the switch 27 is in the position indicated in the Figure (D flip-flop inhibited or absent) and the signal DS is transmitted under the control of the interruptors 32 and 33 by means of an inverter 35 and a reverse-connected diode 36. The operation resulting from this arrangement is indicated in FIGS. 11 and 12, the ascent of signal DS provokes that the interruptors 32 and 33 are permanently opened (the circuit of FIG. 10 is inhibited). The time diagrams are drawn for two different initial conditions: on the lower side (FIG. 12) the clock signal is delayed with respect to the theoretical transition at the middle of a bit (an elementary data period); on the upper side (FIG. 11) the clock signal is advanced.

If the signal DS ascends before the first transition of the signal RD (see FIG. 13), the circuit of FIG. 1D comprises the D flip-flop denoted by 26 and the switch 27 (preferably operated manually) in the position opposite to that indicated in the Figure. In this case, the signal DS is supplied after inversion at 35 to the reset input $C_D$ of the flip-flop and the signal at S (FIG. 1) is supplied through a terminal S', designated as third input terminal of the rapid synchronization circuit, to the clock input of the D flip-flop. The cathode of the diode 36 being connected to the $\overline{Q}$ output of the flip-flop (signal SR), the operation is that indicated in FIG. 13: the ascent of signal DS provokes the descent of signal SR at a time $t_x$ after the first transition so that a rapid synchronization can be obtained during the first transition and then the interrupters 32 and 33 can be permanently opened (circuit of FIG. 10 inhibited) starting from the second transition (maintenance of the synchronization by the bit synchronizer circuit of FIG. 1). In FIG. 10, the elements 26, 32, 33 and 35 are supplied by the voltages U and 0 (ground).

In the arrangements of FIGS. 1 and 10, especially the logic or analog functions have been described. In practice, the arrangement is preferably realized as described with reference to FIG. 14. Since the arrangement is an analog circuit, a fairly high precision is required especially with respect to the voltage values and certain elements have to be joined or modified with respect to the diagrams of FIGS. 1 and 10. The arrangement of FIG. 14 has the following advantages:

a circuit that can be realized and utilized in a simple manner;

the oscillator used does not require a quartz clock generator;

a single supply voltage is necessary (voltage U);

the inputs/outputs are CMOS-compatible;

a compact and economical circuit;

the assembly of functions can be regrouped on a hybrid circuit (thick-film) of 50 mm×25.4 mm (2"×1");

it comprises only three integrated circuits (a quadruple operational amplifier realized in BIFET technology, a quadruple interruptor and a quadruple Exclusive OR circuit realized in CMOS technology);

a high performance circuit:
  the arrangement has a high stability with respect to the variations in temperature and supply voltage;
  the reliability is increased by the use of the technology of thick-film hybrid circuits;
  the base time signal supplied (point C) is not affected by jitter, as in the digital bit synchronizer circuits.

Figure 14:
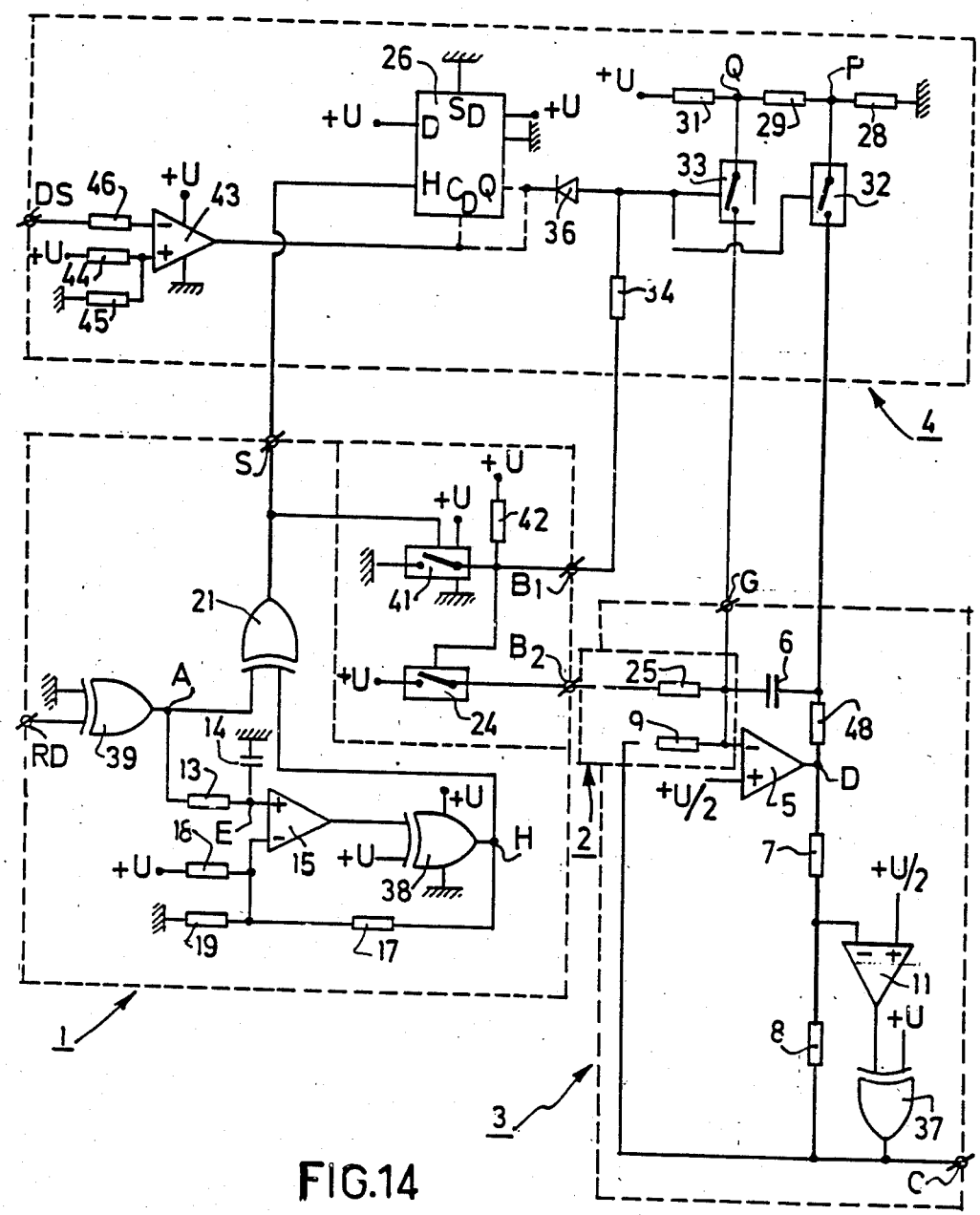
FIG. 14 shows a detailed circuit diagram of the embodiment shown in FIG. 1, inclusive of a rapid synchronization circuit.

In FIG. 14, the inverters 12 and 16 of FIG. 1 are realized by means of Exclusive OR circuits 37 and 38, respectively, one input of which is connected to the voltage +U. In the transition detector 1, an Exclusive OR circuit 39 serves to supply to the point A an accurately calibrated voltage. Possibly, in order to render the CMOS technology of circuit 39 compatible with the BIFET technology of element 15, a potentiometer arrangement (not shown) permits of applying to the point A the two voltage value $\epsilon U$ and $(1-\epsilon)U$, $\epsilon$ being a number which is small with respect to 1. This permits of avoiding a latching phenomenon of element 15. The inverter 23 (FIG. 1) is realized by an interruptor 41 which is controlled from the point S and one end of which is connected to ground and the other end (point $B_1$) to the supply voltage +U through a resistor 42 having a value $R_{42}$. The inverter 35 (FIG. 10) is realized by means of an operational amplifier 43 connected as a comparator (it could also be realized by an Exclusive OR circuit connected as the elements 37 or 38). The conductors indicated by broken lines between the elements 36 and 43 illustrate the two possibilities of utilizing the signal DS already described above which correspond to two embodiments of the rapid synchronization circuit. The four Exclusive OR circuits 21, 37, 38, 39 belong to one integrated circuit ("chip"), just as do the four operational amplifiers 5, 11, 15, 43 and the four interruptors 24, 32 33, 41, each of the three chips being supplied by the voltages +U and 0 (ground). It should be noted that a resistor 48 having a value R48 is connected between the capacitor 6 and the point D. This resistor of low value protects operational amplifier 5 when the interruptors 32 and 33 are closed. Its presence does not change at all the operation of the bit synchronizer arrangement described above. The resistors are realized in hybrid technology and can be mechanically adjusted so as to obtain increasing values by trimming with the aid of a laser.

The values of certain elements of the circuit shown in FIG. 14 are, for example, as follows:

$C_6 = 2.7$ nF
$R_7 = 10$ k$\Omega$
$R_8 = 20$ k$\Omega$
$R_{48} = 1$ k$\Omega$
$R_9 = R_{25} = 154$ k$\Omega$
$R_{13} = 37.4$ k$\Omega$
$C_{14} = 1$ nF
$R_{18} = R_{19} = 20$ k$\Omega$
$R_{17} = 10$ k$\Omega$
$R_{42}$ k$\Omega$
$R_{28} = R_{29} = 1.1$ k$\Omega$
$R_{31} = 2$ k$\Omega$
$R_{44} = 10$ k$\Omega$
$R_{45} = 2.7$ k$\Omega$
$R_{46} = 100$ k$\Omega$ According to a particular embodiment (not shown), the absence of jitter at the sampling instant can be utilized for improving the precision of the sampling instant. In fact, it is set out above that, when the voltage ramps (point D) have the same slope in absolute value, the delay in sampling is on an average equal to the correction step $\theta$. It is possible to eliminate, at low expense, this average delay time: for this purpose, it suffices to slightly increase the slope of the positive ramp and to slightly decrease the slope of the negative ramp so that the free period $T_{OS}$ of the oscillator remains unchanged. Under these conditions, each leading edge of the time base signal then ocurs accurately at the middle of an elementary data interval.

If it is assumed that $\theta = k'T$ ($\theta = k'T_{OS}$), $k'$ being a number which is small with respect to unity, the slopes of the positive and negative ramps have consequently to be modified so that there is obtained:

$$\Delta T_1 = (T_{OS}/2)(1-2k') \text{ and } \Delta T_2 = (T_{OS}/2)(1+2k')$$

This means, for example, for $k' = 1/16 = 0.0625$:

$$\Delta T_1 = 0.875(T_{OS}/2) \quad (16)$$

and $$\Delta T_2 = 1.125(T_{OS}/2) \quad (17)$$

This result can be obtained on first approximation, for example, by slightly increasing the value of the voltage at the non-inverting input of the operational. Let it be assumed that $k''U/2$ in this new voltage value, $k''$ being a number slightly higher than 1. The calculations show that for:

$$\frac{1 + 4k'}{1 + 2k'} < k'' < \frac{1}{1 - 2k'} \quad (18)$$

approximately the desired values for $\Delta T_1$ and $\Delta T_2$ are obtained. Continuing the numerical example for $k' = 1/16$, there is obtained, for example, for $k'' = 1.12$ (satisfying the inequality (18) above):

$$T''_{OS} = 1.014 \, T_{OS}$$

with $$\Delta T_1 = \frac{1}{k''} \frac{T_{OS}}{2} = 0.893 \frac{T_{OS}}{2}$$

and $$\Delta T_2 = \frac{1}{2 - k''} \frac{T_{OS}}{2} = 1.136 \frac{T_{OS}}{2}$$

The slopes of the ramps which were proportional to the currents $i_1$, $i_2$, $i'_1$, $i'_2$, i.e. to 0,1, $-2$, $-1$, respectively, then becomes proportional to $k''-1$, $k''/2$, $k''-2$ and $k''/2-1$, i.e. to: 0.24; 1.12; $-1.76$; $-0.88$ and:

$$t_x = \theta_2 = T/16 \text{ and } \theta_1 = 0.75 \, T/16$$

In this numerical example, it can also be verified that the average delay in sampling is approximately ten times smaller ($\theta/10$ instead of $\theta$). The slight increase of 1.4% in the period $T_{OS}$ of the oscillator is simply compensated for as soon as the synchronization is obtained.

If the period $T_{OS}$ of the oscillator should be retained, it is possible moreover to influence the ratio R7/R8, to which $\Delta V$ and consequently $T_{OS}$ and $\theta_1$ are proportional, by multiplying this ratio by a value m near unity.

In the numerical example chosen above, there has to be chosen:

$$m = 1/1.014 = 0.986,$$

from which it follows that:

$$T'''_{OS} = T_{OS} \text{ with } \Delta T_1 = 0.88(T_{OS}/2) \text{ and } \Delta T_2 = 1.12(T_{OS}/2),$$

the values of $\Delta T_1$ and $\Delta T_2$ being very close to the theoretical values of the formulae (16) and (17) and:

$$\theta_1 = 0.75 \times 0.986(T/16) = 0.74(T/16).$$

It should be noted, in virtue of the above condition (12), that in order to obtain synchronization in all cases the following relation has to be satisfied:

$$|T - T_{OS}| < \theta_1$$

or $$|T - T_{OS}| < 0.046 \, T.$$

What is claimed is:

1. A bit synchronization apparatus for furnishing an output signal synchronized to asynchronously received data signals constituted by binary pulse trains having a base frequency and detectable transitions between binary states, comprising,
- transition detector means for receiving said data signals and generating a correction pulse having a predetermined duration in response to each transition of said data signals;
- oscillator means for generating a sequence of triangular signals each having a first and second side respectively having a finite first and second slope, said sequence of triangular signals having a frequency corresponding to said base frequency whereby an instantaneous phase shift exists between said received data signals and said triangular signals;
- phase correction means interconnected between said transition detector means and said oscillator means for changing said first or said second slope in a direction decreasing said phase shift during occurrence of each of said correction pulses when said correction pulse occurs during said first or second side, respectively; and
- means for generating said output signals in synchronism with said triangular signals.

2. Apparatus as set forth in claim 1, wherein said oscillator means comprises an operational amplifier having an operational amplifier output, an inverting input and a capacitor connected to said output and said inverting input;
- wherein said output signal generating means comprises a bistable circuit having a bistable circuit output;
- further comprising a first resistor connected to said bistable circuit output and said inverting input; and
- wherein said phase correction means comprises a second resistor substantially equal in resistance to said first resistor and connected between said transition detector means and said inverting input of said operational amplifier.

3. Apparatus as set forth in claim 2, wherein said first slope has a predetermined magnitude and said second slope has a magnitude equal to said predetermined magnitude; and
- wherein said first resistor has a predetermined resistance and said second resistor has a resistance equal to said predetermined resistance.

4. Apparatus as set forth in claim 2, wherein each of said pulse trains comprises a first pulse; further comprising rapid synchronization means connected to said oscillator means for completely phase resetting said oscillator means during said first pulse.

5. Apparatus as set forth in claim 4, wherein said rapid synchronization means comprises resistive discharge circuit means, interruptor means connecting said discharge circuit means to said oscillator means when closed, and means connecting said interruptor means to said transition detector means so that said interruptor means is closed during said correction pulse.

6. Apparatus as set forth in claim 5, further comprising means for generating a data detection signal indicative of presence of said pulse trains, and means for applying said data detection signal to said interruptor means, to maintain said interruptor means open after said first pulse.

7. Apparatus as set forth in claim 6, wherein each of said pulse trains commences with a first pulse;
- further comprising means for generating a data detection signal prior to occurrence of said first pulse, a flip-flop having a clock input connected to receive said data detection signal, a set input connected to receive said correction pulse and a flip-flop output connected to said interruptor means so that said interruptor means is closed during said first pulse and opened thereafter.

8. Apparatus as set forth in claim 1, wherein said first slope of said first side of said triangular signal has a predetermined magnitude, and wherein said second slope has a magnitude less than said predetermined magnitude.

9. Apparatus as set forth in claim 8, wherein said operational amplifier further has a direct input;
- and wherein said means for changing said slopes of said first and second sides comprises means for changing the voltage at said direct input of said operational amplifier.

10. Apparatus as set forth in claim 1, wherein said apparatus is manufactured in CMOS Technology.

11. Apparatus as set forth in claim 1, wherein said apparatus manufactured by thick-film hybrid circuit technology.

12. Apparatus as set forth in claim 1, wherein said first side and second sides each have a time duration; and wherein said predetermined duration of said correction pulse is substantially less than said time duration of said sides.

* * * * *